United States Patent [19]

Hatada et al.

[11] 4,293,637
[45] Oct. 6, 1981

[54] METHOD OF MAKING METAL ELECTRODE OF SEMICONDUCTOR DEVICE

[75] Inventors: Kenzo Hatada, Katano; Takao Kajiwara, Kawanishi, both of Japan

[73] Assignee: Matsushita Electric Industrial Co., Ltd., Osaka, Japan

[21] Appl. No.: 82,426

[22] Filed: Oct. 5, 1979

Related U.S. Application Data

[63] Continuation of Ser. No. 909,445, May 25, 1978, abandoned.

[30] Foreign Application Priority Data

May 31, 1977 [JP] Japan ................... 52-64409
May 31, 1977 [JP] Japan ................... 52-64410

[51] Int. Cl.$^3$ ................... H01L 21/283; H01L 21/288
[52] U.S. Cl. ................... 430/314; 204/15; 427/89; 427/90; 430/315; 430; 318;
[58] Field of Search ............... 430/313, 314, 315, 310; 204/15

[56] References Cited

U.S. PATENT DOCUMENTS

| | | | |
|---|---|---|---|
| 3,462,349 | 8/1969 | Gokgenyi | 357/71 |
| 3,737,380 | 6/1973 | Bachmeier | 427/89 |
| 3,761,309 | 9/1973 | Schmitter | 357/71 |
| 3,809,625 | 5/1974 | Brown | 357/71 |
| 3,821,785 | 6/1974 | Rose | 357/71 |
| 4,042,954 | 8/1977 | Harris | 427/89 |
| 4,057,659 | 11/1977 | Pammer | 427/89 |
| 4,182,781 | 1/1980 | Hooper et al. | 430/314 |
| 4,188,438 | 2/1980 | Burns | 427/89 |

FOREIGN PATENT DOCUMENTS 49-65183  6/1974  Japan .
51-33562  3/1976  Japan .

OTHER PUBLICATIONS

A. van der Drift et al., "Integrated Circuits with Leads on Flexible Tape", Solid State Technology, Feb. 1976.
Lyman "Special Report: Film Carriers Star in High-Volume I. C. Production", Electronics, Dec. 1975
Sakane, Internepcon Japan Seminar Program, Jan. 22-25, 1975 I. C. Assembly Process by Mini Mod Method.
Zihoy, Publication of Oki Electric Co., Ltd., vol. 37, No. 3, pp. 100-108, Oct. 1970.

*Primary Examiner*—John D. Smith
*Attorney, Agent, or Firm*—Cushman, Darby & Cushman

[57] ABSTRACT

Method of making metal electrode, characterized by having the steps of:
forming double layers of metal on the principal face of the semiconductor substrate which has electrode pads contacting specified regions of the semiconductor substrate,
forming a photosensitive film on the whole surface of the metal double layers,
etching said photosensitive film in a manner to selectively form openings on areas above the electrode pads, thereby exposing parts of the double layers above the electrode pads,
forming metal bumps on said exposed surfaces of said double layers,
removing said photosensitive film while retaining narrow surrounding parts around said metal bumps, and
etching said double layers of metal by utilizing said narrow surrounding parts as etching mask, thereby removing the parts of said double layers which is covered by said narrow surrounding parts.

16 Claims, 18 Drawing Figures

FIG. 2 (a)
(INVENTOR'S PRIOR METHOD)

METHOD OF MAKING METAL ELECTRODE OF SEMICONDUCTOR DEVICE

This is a continuation of application Ser. No. 909,445 filed May 25, 1978 now abandoned.

BACKGROUND OF THE INVENTION

1. Field of the Invention

This invention relates to a method of making semiconductor device, especially with metal bumps.

2. Prior Art

In recent years, fabrication method of a semiconductor device wherein metal bumps are formed on semiconductor substrate for contacting to external leads directly therewith by simultaneous thermo-compression bonding, thereby dispensing with one-by-one bonding of fine gold wires. The metal bumps are generally formed by plating on metal layers which are formed on electrode pads formed on specified parts of the substrate. Conventional method of forming the metal bumps has shortcoming that bonding force of the bumps on the substrate is not sufficient, because an etchant used in the process likely etches the electrode pads.

Figure 1A:
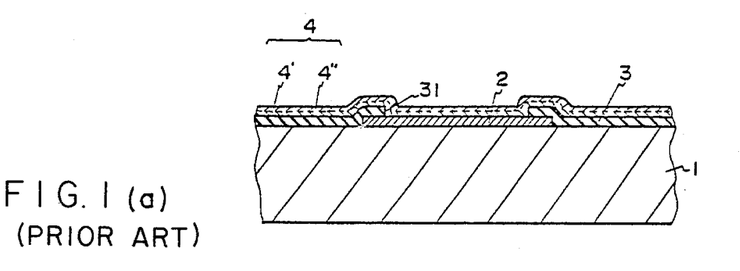
FIG. 1(a) to FIG. 1(c) are schematic sectional elevation views of conventional steps of forming metal bumps on semiconductor substrate.
Figure 1B:
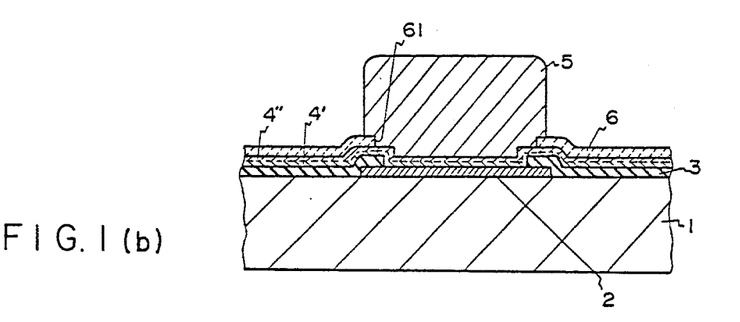
Figure 1C:
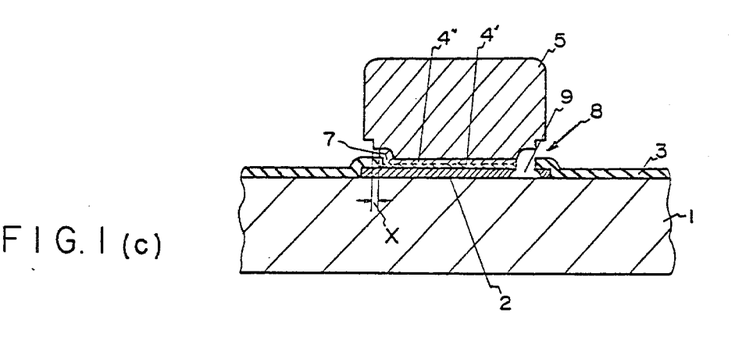

FIG. 1(a), FIG. 1(b) and FIG. 1(c) show steps of such conventional method. The conventional method is elucidated in detail referring to FIG. 1(a) to FIG. 1(c). First, electrode pads 2 of aluminum film are formed on specified parts of the principal face of the silicon substrate 1 to connect it and lead out. On all the way of the principal face, an insulating film 3 of, for example, SiO$_2$ is formed by known chemical vapor deposition method, and then, openings 31 are formed by means of known photo-etching method in a manner to expose almost area of the electrode pads 2, but retaining peripheral parts of the electrode pads 2 covered under the insulating film 3.

Next, by means of sputtering method or vacuum deposition method, for example, resistor heating method or electron-beam method, metal double layers 4' and 4" are formed on all the way of the principal face. The metal layers 4' and 4" are called barrier metals and are formed of two layers, a lower layer 4' and an upper layer 4" as shown in FIG. 1(a). The lower layer 4' is formed with such a metal that can make a strong contact with the electrode pads 2 of aluminum film and the chemical-vapor deposited insulating film 3 of such as SiO$_2$. For example, chromium or titanium is suitable for the lower layer 4'. The upper layer 4" is formed with such a metal on that a metal bump 5 can be firmly formed in the subsequent step. For example, copper, nickel, gold, silver, platinum or/and lead are suitable for the upper layer 4".

Then, a photoresist film 6 is formed on all the way of the double metal layers 4' and 4", and openings 61 are formed by known photolithographic method so as to have the area corresponding to that of the electrode pad 2 thereby exposing the upper layer 4" therethrough. Thereafter, metal bumps 5 of thick metal layer is formed as shown in FIG. 1(b) by known electrolytic plating on the exposed area of the upper layer 4" by utilizing the exposed double metal layer 4' & 4" as electrode. Gold is suitable for the material of the metal bumps.

Then, the photoresist film 6 is removed by using known photoresist stripper, and subsequently, parts of the double layers 4' and 4" which are not covered by the metal bumps 5 are etched away by utilizing the metal bumps 5 as etching masks as shown in FIG. 1(c).

Inventors found that the abovementioned conventional method of making the metal bump has the following shortcomings that:

(1) The gold bumps 5 are utilized as etching masks in chemical etching to remove the metal double layers 4' and 4". In the etching, strong etchant comprising mixture of pottasium ferricyanide and sodium hydroxide or ferric chloride is used, and therefore, undesirable undercuttings of the metal double layers 4' and 4" occurs, thereby etching the double layers under the gold bump by the extent of etching width x. Sometimes the etching width reaches 5–10 μm inward from the peripheral of the metal bump 5, and sometimes dissolves parts of electrode pad so as to make hollow 9 as shown in FIG. 1(c). Such undesirable dissolving causes electrical failure as well as decrease of contacting power of the metal bumps 5.

(2) The abovementioned shortcoming can be overcome when the openings (for electrolytic plating) in the photoresist film 6 is made larger than those of the openings in the SiO$_2$ film 3 by the extent of the undercutting width x. However, such measure necessarily increases the width of the metal bumps 5, as well as increases pitches of the metal bumps. This leads undesirable increase of the size of IC or LSI wherein many lead wires must be integrated within a limited area.

Figure 2:
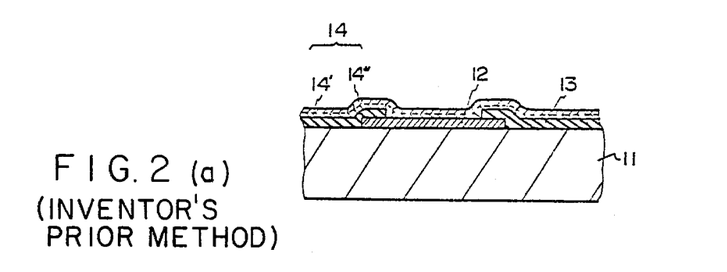
FIG. 2(a) to FIG. 2(d) are schematic sectional elevation views of inventors' improved process of forming metal bumps on semiconductor substrate, the improvement being preceding the present invention but not disclosed yet.
Figure 3:
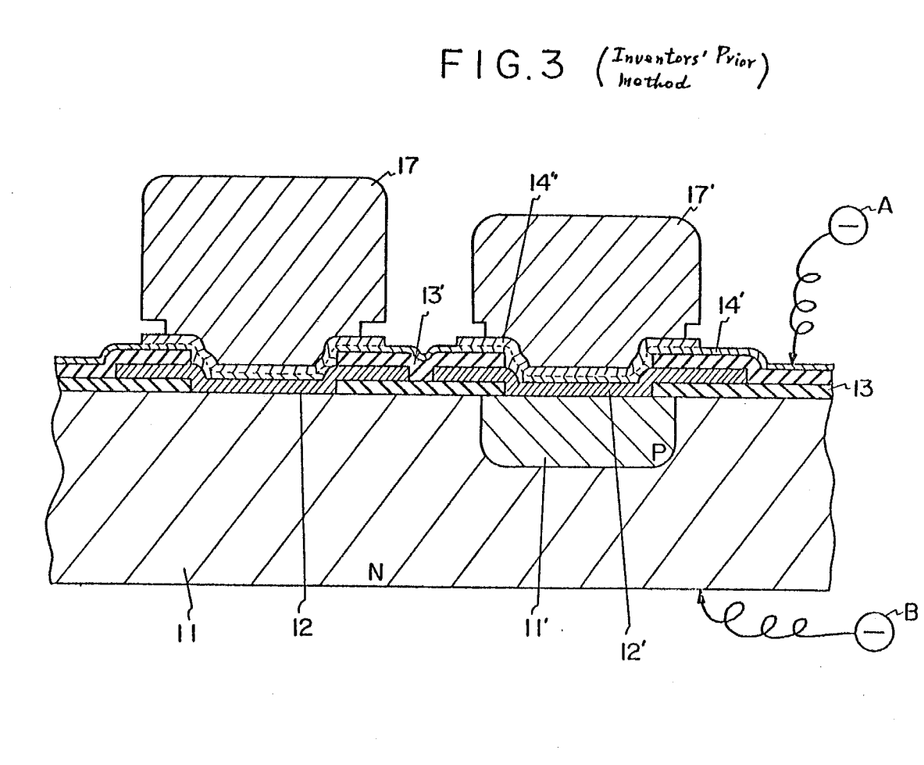
FIG. 3 is a schematic sectional elevation view showing inventor's another improved process of forming metal bumps on semiconductor substrate, the improvement being preceding the present invention but not disclosed yet.

In order to improve the abovementioned shortcomings, the inventors made preliminary improvements as shown in FIG. 2 and FIG. 3. These improvements are not yet disclosed to the public, and hence do not form the state of the art, but are described here for better understanding of the object and are only preliminary steps to the present invention.

In the inventors' preliminary improvement of FIG. 2, the feature is to make the area of the metal double layers 14' and 14" larger than that of the area of the metal bump 5, thereby to prevent the undercutting.

First, electrode pads 12 of aluminum film are formed on specified parts of the principal face of the silicon substrate 11 to connect it and lead out. On all the way of the principal face, an insulating film 13 is formed by known chemical vapor deposition method, and then, openings 131 are formed by means of known photo-etching method in a manner to expose almost area of the aluminum electrode pad 12, but retaining peripheral parts of the electrode pads 12 covered under the insulating film 13.

Next, by means of sputtering method or vacuum deposition method, for example, resistor heating method or electron-beam method, metal double layers 14' and 14" are formed on all the way of the principal face. The metal layers 14' and 14" are called barrier metals and are formed of two layers, a lower layer 14' and an upper layer 14" as shown in FIG. 2(a). The lower layer 14' is formed with such a metal, that can make a strong contact with the electrode pads 2 of aluminum film and the chemical-vapor deposited insulating film 13 of such as SiO$_2$. For example, chromium or titanium is suitable for the lower layer 14'. The upper layer 14" is formed with such a metal on that a metal bump 5 can be firmly formed in the subsequent step. For example, copper, nickel, gold, silver, platinum or/and lead are suitable for the upper layer 14".

Then, a photoresist films 15 are formed on the upper layer 14" in a manner to have the areas which are a little wider than the areas of the electrode pads 12. Subsequently, the exposed areas of the upper layer 14", namely the parts of the upper layer 14" which are not covered by the photoresist films 15, are removed by a chemical etching by utilizing the photoresist films 15 as etching masks as shown in FIG. 2(b). The lower layer 14' is retained all the way of the principal face for the sake of later use as electric conductor in the step of electrolytic plating of the metal bumps. The retained lower layer 14' is used for forming the metal bumps on the regions of P-type conductivity formed in the semiconductor substrate of the N-type conductivity.

Then, the first photoresist film 15 is removed by known photoresist stripper, and subsequently, a second photoresist film 16 is formed by known photolithographic method in a manner to have openings 161 which are substantially over the area of the electrode pads 12. Thereafter, by utilizing the exposed parts of the lower metal layer 14' as electric conductor, a metal suitable for metal bump, such as gold, is plated by electrolytic plating method by utilizing the lower metal layer 14' as electric conductor and the exposed part of the upper metal layer 14" as electrode, so that the gold bumps 17 are formed on the exposed area of the upper layer 14" as shown in FIG. 2(c).

Next, the second photoresist film 16 is removed by known method, and subsequently, the lower metal layer 14' of the part which is not covered by the upper metal layer 14" is removed by known selective etching method by utilizing the upper metal layer 14" as the etching mask, thus completing the bump construction as shown in FIG. 2(d).

The method of FIG. 2 still has the following drawbacks:

(1) By using the upper metal layer 14" as the etching mask in the final stage, the upper metal layer is also etched to some extent, and therefore, the etchant infiltrates into the double metal layer from the peripheral part 18 of the interface between the metal bump 17 and the upper metal layer 14", into the aluminum electrode pad 12. Therefore, the infiltration of the etchant undesirably etches peripheral parts of the electrode pad 12, thereby producing electrical unstability of the device.

(2) For the upper metal layer 14" copper layer is suitable for obtaining strong mechanical contacting force with the overlying plated layer. The copper layer 14" is likely to form oxide film thereon in the subsequent steps. The first photoresist film 15 is processed with post-baking at 140° C. to 200° C. in order to strengthen adhesive force on the upper metal layer 14". Such post-baking is generally used when such photoresist film is used as etching mask for etching oxide-covered copper layer 14". As a result of the post-baking the photoresist film becomes very strong, and hence, removing of it requires immersing it for 5 to 10 minutes in 90° C. to 100° C. hot very strong solvent (mainly consisting of surface actant) called J-100. Such strong solvent at such high temperature undesirably etches the upper metal layer 14" with such a high etching speed of 500° A per 6 minutes. Furthermore, the surface of the upper metal layer 14" is contaminated by the solvent, and therefore adhesive power between the metal bump 17 and the copper layer 14" is decreased and/or yield of forming the metal bump 17 becomes very poor.

(3) When a region 11' of P-type conductivity is formed as shown in FIG. 3 in an substrate 11 of N-type conductivity, and a metal bump 17' is formed on the P-type region 11', then it is necessary to use the lower metal layer 14' as electric conductor for the electrolytic plating. Namely, in FIG. 3, in order to form the metal bump by electrolytic plating method, the substrate 11 must be connected to the negative terminal B of a D.C. power source. In FIG. 3 parts corresponding to those of FIG. 2(d) are designated by corresponding numerals, and 12' and 13' designate electrode pad and insulating layer, respectively. When the substrate 11 is connected to the negative terminal, then a plating current can flow through the metal double layers 14' and 14" formed on the N-type region 11 of the substrate to the substrate 11, but another current from the metal double layer 14' and 14" formed on the P-type region 11', through the P-type region 11', to the N-type substrate 11 hardly flows, since the P-type region 11' and the N-type substrate 11 form a P-N junction of the reverse direction to the current. Therefore, forming of metal bump 17' on the P-type region is not possible. Therefore, it can be considered to use the lower metal layer 14' as electric path for the electrolytic plating to be connected a negative terminal A of a D.C. power source. But the lower metal layer 14' is made with chromium or titanium, in order to serve as barrier layer against diffusion of the overlying cupper and gold into the electrode pad 12' and further into the semiconductor substrate 11 or into the N-type region 11', and such metal as chromium or titanium has high resistivity for the electric path for plating. Therefore, the metal bump 17' formed on the P-type region 11' has smaller height (thickness) than other bumps 17 formed on the N-type substrate 11. Such non-uniform heights of the bumps causes unreliable contactings in the subsequent press-bonding to the external lead wires.

The specific resistivity of the vapor-deposited chromium film 14' changes responding with speed of vapor-deposition and thickness of the film 14'. For example, a 1,000 Å thick chromium film made with the speed of 1Å per second has $10^{-2}$ Ωcm resistivity, the same made with the speed of 2Å per second has $10^{-3}$ Ωcm and the same made with the speed of 5Å per second has $8\times10^{-4}$ Ωcm. According to our experiment, the same chromium film made with the speed of 2.2-2.9Å per second shows the resistivity of $1.7\times10^{-3}$ Ωcm.

In FIG. 3, provided that the distance of the part where chromium layer 14' is exposed between the first metal bump 17 and the second metal bump 17' is 0.4 mm, the width is 50 mm and the thickness is 1,000Å, then the resistance of the chromium layer of this part is 1.7Ω, and when the distance is 1.2 mm the resistance of the same part is 5.1Ω. When the metal bumps 17 and 17' of gold are formed by electrolytic plating, provided that the plating is made with the current density of 0.035 mA/mm², then on the double metal layers on the electrode pad 12 on the N-type substrate 11 the plating is made with the current density of 0.035 mA/mm². But, on the double metal layers on the electrode pad 12 on the P-type region 11' the plating is made with the current density of 0.029 mA/mm² for the abovementioned distance of 0.4 mm and 0.023 mA/mm² for the distance of 1.2 mm. As a result of calculation, the plating speed on the N-type substrate 11 is 11.2 μm/hour for the above-mentioned current density of 0.035 mA/mm², while the plating speed on the P-type region 11' is 9.2 μm/hour for the current density of 0.029 mA/mm² and 7 μm/hour for the current density of 0.023 mA/mm². Thus, due to the non-uniformity of the plating speed, the height of the metal bump differs as shown in FIG. 3. Furthermore, because the chromium layer 14' has the high resistivity, only on the parts which are close to the part connected to the negative terminal B the metal bump becomes tall while they are lower in more apart parts.

SUMMARY OF THE INVENTION

The present invention purports to provide novel method of making metal electrode of semiconductor device wherein the abovementioned problems are solved.

One object of the present invention is to make strong metal bumps.

Another object of the present invention is to avoid undesirable etching of external lead wires of the semiconductor device.

Another object of the present invention is to make metal bumps of substantially uniform height even on different kind regions.

DESCRIPTION OF THE INVENTION

Hereinafter, the present invention is described in detail referring to the drawings of FIG. 5(a) to FIG. 5(e), which show a preferred embodiment of the making method of the present invention.

A first example of the present invention using a positive type photoresist is shown by FIG. 4(a) to FIG. 4(e).

Figure 4:
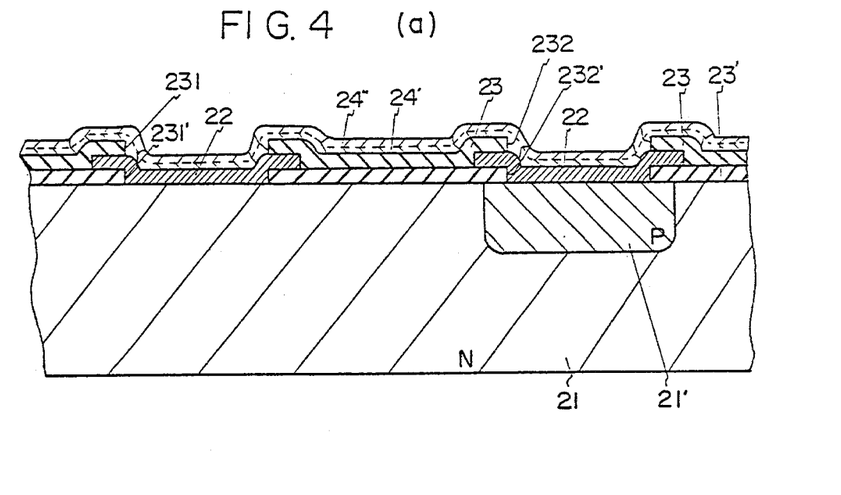
FIG. 4(a) to FIG. 4(e) are schematic sectional elevation views showing steps of making method of metal electrode of semiconductor device in accordance with the present invention.

On a specified part of the principal face of a semiconductor substrate 21 of, for example, silicon, and insulating film 23' of, for example, SiO₂ with openings 231' and 232" on specified parts are formed using a low temperature process. And then, electrode pads 22 or an interconnection pattern is formed by vapor-depositing a metal, for example, aluminum. The electrode pads 22 are formed on the openings 231' and 232' so as to extend outside thereof by a specified distance. The electrode pads 22 are formed both on the N-type substrate 21 and on the P-type region 21'. One example of the actual device is an IC logic device comprising a large number of diodes, each having the P-type diffused region in the N-type substrate. Then, another insulating film 23 is formed with a low-temperature process over the entire principal face. For example, an SiO₂ film 23 of about 1 micron in thickness is formed by a chemical vapor-deposition method. Openings 231 and 232 are formed above the electrode pads 22 which openings are smaller then the pads, thereby exposing a portion of the electrode pad therethrough. In actual IC devices, a number of such electrode pads are provided on one semiconductor substrate, with the pitch of, for example, several tens of electrodes per 1 mm. Thereafter, double metal layers consisting of the lower metal layer 24' and the upper metal layer 24" are formed by a known sputtering method or a vacuum-deposition method, for example, a resistor heating method or an electron-beam method. The metal layers 24' and 24" are called barrier metals. The lower layer 24' is formed with a metal that can make a strong contact with the electrode pads 22 of aluminum film and the chemical-vapor deposited insulating film 23 such as SiO₂. For example, chromium or titanium is suitable for the lower layer 24'. The upper layer 24" is formed with a metal on which bumps 26 can be firmly formed in the subsequent step. For example, copper, nickel, gold, silver, platinum and/or lead are suitable for the upper layer 24".

As an example, the lower layer 24' is made with chromium 1,000 Angstroms in thickness and the upper layer 24" is made with copper 5,000 Angstroms in thickness. These two layers are formed in sequence in the same vacuum chamber as shown in FIG. 4(a). The lower layer 24' of chromium has a strong adhesive force to the aluminum film of the electrode pads 22 and to the insulating film 23 SiO₂; the upper layer 24" of copper has a strong adhesive force to the subsequently formed metal bumps 26.

Then, a known positive type photoresist film 25 is formed over the entire surface of the upper layer 24", and openings 251 are formed by a known photolithography method on the areas corresponding the areas of the electrode pads 22, thereby exposing the upper layer 24" through the opening 251. Since a positive type photoresist film 25 is used, the areas which will form openings 251 are exposed to a photochemical light such as U.V. light thereby to render the exposed areas soluble, and in a subsequent developing step the solubilized areas on the photoresist film are removed.

Then, by utilizing the double metal layers 24' and 24" as electrodes for electrolytic platign and utilizing the photoresist film 25 as a mask for plating, an electrolytic plating is made forming the metal bumps 26, for example, of gold on the exposed surface of the upper metal layer 24". Thus, the metal bumps 26 of about 15 to 20 microns in height, 70 microns in width are formed as shown in FIG. 4(b) with 100 micron distance inbetween. Besides gold, copper silver or tin can be used to form the metal bumps 26. Non-electrolytic plating can be used to form the metal bumps.

Next, while retaining the positive type photosensitive film 26 on the substrate, by using a second photomask 27 as shown in FIG. 4(c), a second exposure to photochemical light is made. The second photomask 27 has a light-stopping part 27" which is slightly larger than the area of the metal bump 26, so that the metal bump and a specified narrow area of the photoresist film 25 around the metal bump 26 is shadowed in the second exposure. Therefore, the part 25" of photoresist film 25 except in the narrow area 25' around the metal bump 26 is rendered soluble. Only the narrow area 25' of the photoresist film 25 remains after the development process subsequent to the second exposure; this is shown in FIG. 4(d).

Then, the double metal layers 24' and 24" are removed by chemical etching utilizing the retained narrow photoresist film 25' as the etching mask. When the double metal layers 24' and 24" are made with chromium and copper, respectively, then the upper layer 24" of copper can be removed by aqueous solution of ferric chloride of about 10% concentration or phosphoric acid. The lower layer 24' of chromium can be removed by an aqueous solution of hydrochloric acid or mied aqueous solution of potassium ferricyanide and sodium hydroxide. Therefore, the upper layer 24" and the lower layer 24' can be etched by successive etchings. Other methods of etching the double metal layers, for example, a dry etching method such as plasma etching or sputter etching also can be used.

Finally, the narrow photoresist mask 25" is removed and the making process of the metal bump is completed as shown in FIG. 4(e).

Alternatively, the photoresist film 25' encirclying the metal bump 26 can be retained. By retaining the photoresist film 25', infiltration of an undesirable contaminating substance into the gap 270 between the metal bump 26 and the double metal layers 24' and 24" can be prevented, thereby preventing undesirable etching of the double metal layers 24' and 24" and of the aluminum electrode pads 22 and resultant deterioration of the electric characteristics. However, when the semiconductor device made in accordance with the abovementioned method is thoroughly wrapped with protecting film, for example, after installing on a mount, then the photoresist film 25' can be removed.

A second example of the present invention is elucidated referring to FIG. 5(a) to FIG. 5(e).

Figure 5:
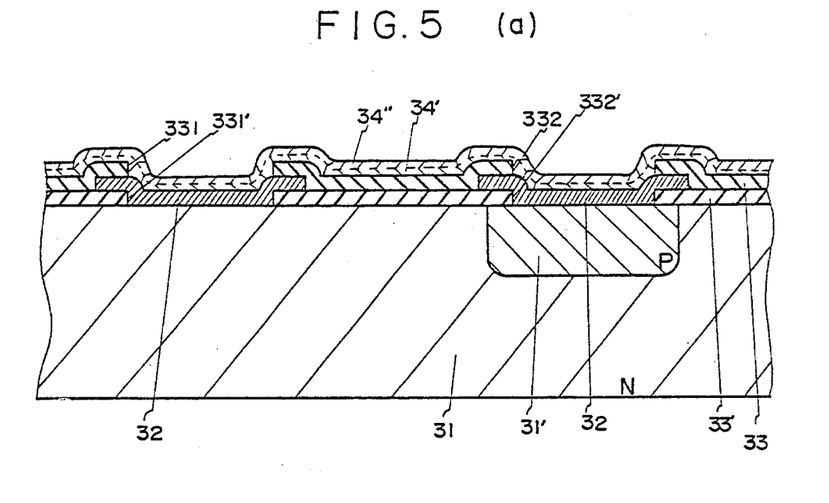
FIG. 5(a) to FIG. 5(e) are schematic sectional elevation views showing steps of another making method of metal electrode of semiconductor device in accordance with the present invention.

On specified part of the principal face of a semiconductor substrate 31 of, for example, silicon, an insulating film 33' of, for example, $SiO_2$ with openings 331' and 332' on specified parts are formed with a thermal oxidation method process. And then, electrode pads 32 or interconnection pattern are formed by vapor-depositing a metal, for example, aluminum. The electrode pads 32 are formed on the openings 331' and 332' in a manner to extend outside thereof by a specified distance. The electrode pads 32 are formed both on N-type substrate 31 and on P-type region 31'.

One example of the actual device is an IC logic device comprising a large number of diodes, each having the P-type diffused region in the N-type substrate. Then, another insulating film 33 is formed with a low-temperature process on all the way of the principal face. For example, an $SiO_2$ film 33 of about 1 μm thickness is formed by a chemical vapor-deposition method. Openings 331 and 332 are formed above the electrode pads 32 with smaller size thereof, thereby exposing almost part of the electrode pad therethrough. In actual IC devices, a number of such electrode pads are provided on one semiconductor substrate, with the pitch of, for example, several tens of electrodes per 1 mm. Thereafter, double metal layers consisting of the lower metal layer 34' and the upper metal layer 34" are formed by known method of sputtering method, vacuum-deposited method, for example, resistor heating method or electron-beam method. The metal layers 34' and 34" are called barrier metals. The lower layer 34' is formed with such a metal that can make a strong contact with the electrode pads 32 of aluminum film and chemical-vapor deposited insulating film 33' such as $SiO_2$. For example, chromium or titanium is suitable for the lower layer 34'. The upper layer 34" is formed with such a metal on that metal bumps 36 can be firmly formed in the subsequent step. For example, copper, nickel, gold, silver, platinum or//and lead are suitable for the upper layer 34".

For example, the lower layer 34' is made with 1,000Å thick chromium and the upper layer 34" is made with 5,000Å thick copper, and these two layers are formed in sequence in the same vacuum chamber, as shown in FIG. 5(a). The lower layer 34' of chromium has strong adhesive force to the aluminum film of the electrode pads 32 and to the insulating film 33 of $SiO_2$, and the upper layer 34" of copper has strong adhesive force to the subsequently formed metal bumps 56.

Then, a known negative type photoresist film 35 is formed all the way of the upper layer 34"', and openings 351 are formed by known photolithography method on the areas corresponding to the areas of the electrode pads 32, thereby exposing the upper layer 34" through the openings 351. Since the negative photoresist film 35 is used, the areas other than those to become openings 351 are exposed to a photochemical light but the areas to form the openings are masked from the photochemical light thereby hardening the exposed area.

In subsequent developing step, the unexposed areas of the photoresist film is removed to form openings 351.

Then, by utilizing the double metal layers 34' and 34" as electrode for electrolytic plating and utilizing the retained parts of photoresist film 35 as a mask in plating, an electrolytic plating is made to form the metal bumps 36, for example, of gold on the exposed surface of the metal layer 34". Thus, the metal bumps 36 of about 15 to 20 μm height, 70 μm width are formed as shown in FIG. 5(b) with 100 μm distance inbetween. Besides gold, copper silver or tin can be used to form the metal bumps 36. Non-electrolytic plating can be used to form the metal bumps.

Next, the negative-type photoresist film 35 is removed by known remover, for example, organic solvent such as trichloroethylene, and a second negative-type photoresist film 37 is formed on all the way of the principal face. The first photoresist film 35 and the second photoresist film 37 are both of negative type which has photo-polymerization characteristic. Then a second photomask 38 of slightly larger size than the metal bump 36 is disposed with registration that its light-passing windows 38" is above and around the metal bumps 36, and a photochemical light exposure is made as shown in FIG. 5(c), so that a narrow area of the second photoresist 37 around the metal bump 36 is exposed to the photochemical light and photo-polymerized. Accordingly, after the development of the photoresist film 37, the exposed narrow area around the metal bump is retained as mask 37' encircling the metal bump as shown in FIG. 5(d).

Then the double metal layers 34' and 34" are chemically etched by utilizing the retained encircling photoresist mask 37' as etching mask, and the narrow areas 39 of the double metal layers 34' and 34" encircling the metal bump 36 are retained, while other parts of the double metal layers than the retained parts 39 are removed. When the double metal layers 34' and 34" are made with chromium and copper, respectively, then the upper layer 34" of copper can be removed by aqueous solution of ferric chloride of about 10% concentration or phosphoric acid, and the lower layer 34' of chromium can be removed by aqueous solution of hydrochloric acid or mixed aqueous solution of potassium ferricyanide and sodium hydroxide. Therefore, the upper layer 34" and the lower layer 34' can be etched by successive etchings. Other method of etching the double metal layers, for example, dry etching method such as plasma etching or sputter etching can be used, too.

Finally, the retained encircling photoresist mask 37' is removed and the making process of the metal bump is completed as shown in FIG. 5(e).

Alternatively, the encircling photoresist film 37' around the metal bump 36 can be retained.

By so retaining the photoresist film 37', infiltration of undesirable contaminating substance into the gap 40 between the metal bump 36 and the double metal layers 34' and 34" can be prevented, thereby preventing undesirable etching of the double metal layers 34' and 34" and of the aluminum electrode pads 32 and resultant deterioration of electric characteristics. However, when the semiconductor device made in accordance with the abovementioned method is thoroughly wrapped with protecting film, for example, after installing on a mount, then the photoresist film 37' can be removed. In this second example, as a modification, for the first and the second photoresist film the positive-type ones can be used.

The advantages of the present invention is as follows:

(1) Both in the first and the second examples, the photoresist film 25 or 35 is formed on the upper metal layer 24" or 34" immediately after its vapor-deposition. Therefore, the surface of the upper metal layer 24" or 34" is clean. The photoresist film 25 or 35 is treated only at low temperature of about 90° C. Therefore, the developer to develop the photoresist film 25 or 35 is such moderate one as principally of acetone or sodium hydroxide having high purity for the positive-type photoresist film 25 or principally of in organic solvent of xylene or trichloroethylene having high purity for the negative-type photoresist film 35. Since the development is made with such moderate and pure solvents, the surface of the upper metal layer 24" or 34" is kept clean. This is advantageous than the conventional method which have necessitated two steps of developing the baked photoresist film by the strong developer and cleaning by trichloroethylene. Generally, the surface of the vapor-deposited metal immediately after the vapor-deposition is very clean, without oil, organic substance or dust on it. Therefore, when a plating is made on such surface, the plated metal layer has almost no pinholes, the layer is very strong and the surface is smooth and stable, in contradistinction to the conventional plated surface, wherein the plating has been made on a metal surface contaminated by the strong solvent. Thus, the metal bumps 26 and 36 are formed strongly and precisely as designed.

(2) In the conventional method, the peripheral parts of the retained upper layer 4" or 14" twice attached by the strong photoresist removing solvent. The first time is when forming the opening 61 or 161 corresponding to the area of the electrode pad 2 or 12 on the photoresist film 6 or 15, and the second time is when removing the photoresist film 6 or 16 after forming of the metal bump 5 or 17. Since copper film is etched by such strong removing solvent, for example, J-100 (by the merchandise name) at the rate of 500Å/6 minutes, provided that the abovementioned two times of attacks last for 12 minutes in total, the depth of etching of the copper layer 4" or 14" becomes 1,000Å. Furthermore, during the subsequent application of chromium etchant, i.e., mixed solution of potassium ferricyanide and sodium hydroxide for etching the lower metal layer 4' or 14' of chromium by 1,000Å, the copper layer is further etched by 1,000Å to 2,000Å. Therefore, the copper layer becomes very thin thereby allowing infiltration of the etchant into the interface or gap between the metal bump and the copper layer and/or infiltration of other undesirable substance into such interface or gap. Such infiltration of etchant or contaminating substance finally etches the electrode pad 2 or 12 thereby deteriorating characteristic of the conventional device.

However, in the device in accordance with the present invention, the photoresist developing liquid is mild, and hence there is no fear that strong photoresist removing solvent deteriorates the interface under the metal bump or the electrode pad. Furthermore, in the present method, the narrow area of photoresist film 25' or 37' is retained to encircle the metal bump during the etching of the double metal layers 24'-24" or 34'-34", and also, the periphery of the interface under the metal bumps 26 or 36 is covered by the encircling photoresist film 25' or 37'. Therefore, the etching liquids for etching the double metal layer can not infiltrate to the interface or to the electrode pad. Therefore, the contact of the metal bump is secured stable and the aluminum electrode pads on the substrate is free from etching by the contaminations.

(3) In the method of the present invention, steps using liquid is made more sequentially in comparison with the conventional method, and therefore, numbers of washing, drying time period, volume of purified washing water, etc. can be reduced than in the conventional method.

(4) In the present invention, both of the upper layers 24" or 34" and the lower layers 24' or 34' are utilized as electric conductor for the electrode in plating, and therefore, resistance between the different regions such as P-type region and the N-type region and the resistance between the area to be plated and the negative terminal can be made very low. For example, provided that the double metal layers are made with 1,000 Å thick chromium and 5000 Å thick copper, both having 0.4 mm distance between the P-type region and the N-type region and 50 mm width (in the direction perpendicular to the plane of the drawing of FIG. 4(b) or FIG. 5(b)), then the resistivity of the double metal layers is less than $1.7 \times 10^{-6} \Omega cm$. This value is about 1/1,000 of the resistivity of about $1 \times 10^{-3} \Omega cm$ of the single chromium layer of 1,000 Å and 0.4 mm distance $\times$ 50 mm width of the inventor's prior example of FIG. 2(c). Thus, by drastically reducing the resistivity value between the metal layers on the areas to form the metal bumps, it is possible to form the plated metal bumps of the uniform height.

(5) In the first example elucidated referring to FIG. 4(a) to FIG. 4(e), positive-type photoresist film is utilized in a manner firstly to cover the double metal layers during plating of the metal bumps and secondly, after reshaping its pattern by a second exposure, to cover the narrow encircling area of the double metal layers around the metal bumps during etching-away of unnecessary parts of the double layers. By such use of a single photoresist film using two exposures, the steps of applying photoresist film and removing it after etching can be reduced.

What is claimed is:

1. A method of making metal bumps on a semiconductor device including the successive steps of:
   forming electrode pads on predetermined parts of a principal face of a semiconductor substrate,
   forming a multiple layer of metal on said principal face,
   photolithographically forming a first photoresist film on said multiple layer providing openings on areas substantially above said electrode pads thereby exposing predetermined parts of the surface of said multiple layer above said electrode pads, forming metal bumps on said predetermined parts of the surface of said multiple layer exposed through said openings using said first photoresist film as a plating mask, removing said first photoresist film, applying a second photoresist film of negative type over the entire surface of said principal face, exposing selected portions of said second photoresist film using a photomask having a transparent mask pattern size encircling and larger than the projection pattern size of said metal bumps on said semiconductor substrate, developing and etching said second photoresist film to retain a photoresist film pattern around said metal bumps, and thereafter, selectively etching said multiple layer using said retained photoresist film pattern as an etching mask to retain predetermined portions of said multiple layer having a size encircling and larger than the projection pattern size of said metal bumps and removing the parts of said multiple layer which are not covered by said etching mask.

2. The method of making metal bumps of claim 1 wherein said first photoresist film is of a positive type photoresist film.

3. The method of making metal bumps of claim 1 wherein said first photoresist film is of a negative type photoresist film.

4. The method of making metal bumps of claim 1 wherein said metal bumps are formed by electrolytic plating.

5. The method of making metal bumps of claim 2 wherein said metal bumps are formed by electrolytic plating.

6. The method of making metal bumps of claim 3 wherein said metal bumps are formed by electrolytic plating.

7. The method of making metal bumps of claim 1 wherein said metal bumps are formed by non-electrolytic plating.

8. The method of making metal bumps of claim 2 wherein said metal bumps are formed by non-electrolytic plating.

9. The method of making metal bumps of claim 3 wherein said metal bumps are formed by non-electrolytic plating.

10. The method of making metal bumps of claim 1 wherein said multiple layer of metal is retained providing a pattern which encircles said metal bumps, said pattern being larger than said metal bumps in a projected size on said principal face.

11. A method of making metal bumps on a semiconductor device including the successive steps of:

forming electrode pads on specified parts of a principal face of a semiconductor substrate;

forming a first metal layer on said principal face, and forming a second metal layer on said principal face to form a double metal layer, photolithographically forming a first photoresist film on said double layer providing openings on areas substantially above said electrode pads thereby exposing predetermined parts of the surface of said double layer above said electrode pads, forming metal bumps on said predetermined parts of the surface of said double layer exposed through said openings using said first photoresist film forming a plating mask, removing said first photoresist film, applying a second photoresist film over the entire surface of said principal face, said second photoresist film being of the negative type, exposing selected portions of said second photoresist film using a photomask having a light-passing mask pattern size encircling and larger than the projection pattern size of said metal bumps on said principal face, developing and etching said second photoresist film to retain an exposed photoresist film pattern around said metal bumps, and thereafter, selectively etching said double layer using said retained photoresist film pattern to retain predetermined portions of said double layer around said metal bumps.

12. A method of making metal bumps on a semiconductor device including the successive steps of:

forming electrode pads on specified parts of a principal face of a semiconductor substrate, forming a first metal layer on said principal face and forming a second metal layer on said principal face to form a double layer of metal on said principal face, photolithographically forming a first photoresist film on said double layer providing openings on areas substantially above said electrode pads thereby exposing predetermined parts of the surface of said double layer above said electrode pads, forming metal bumps on said predetermined parts of the surface of said double layer exposed through said openings using said first photoresist film which forms a plating mask, removing said first photoresist film, applying a second photoresist film of negative type over the entire surface of said principal, said second photoresist film being of the negative type, exposing selected portions of said second photoresist film using a photomask having a light-passing mask pattern size encircling and larger than the projection pattern size of said metal bumps on said principal face, developing said exposed second photoresist film and retaining a photoresist film pattern around said metal bumps, and thereafter, selectively etching said double layer using said retained photoresist film pattern to retain predetermined portions of said double layer around said metal bumps.

13. The method of making metal bumps on a semiconductor device according to claim 11 wherein said first photoresist film is a positive type photoresist.

14. The method of making metal bumps on a semiconductor device according to claim 12 wherein said first photoresist film is a negative type photoresist.

15. The method of making metal bumps on a semiconductor device according to claim 12 wherein said first photoresist film is a positive type photoresist.

16. A method of forming a plurality of metal closely-spaced bumps for a semiconductor device on the principal surface of a semiconductor substrate, said method consisting essentially in the successive steps of:

A. forming at least one insulating film on said substrate with at least one opening at predetermined portions of said principal surface of said semiconductor substrate;

B. forming metal electrode pads on said predetermined portions of said principal surface of said semiconductor substrate, at least the outer portions of said electrode pads extending onto said insulating film;

C. forming a first metal layer over the entire surface of said substrate;

D. forming a second metal layer over said first metal layer thereby forming a double metal layer;

E. photolithographically applying a first photoresist film onto said double metal layer, providing openings in said first photoresist film in areas substantially above and in register with said electrode pads, thereby exposing predetermined portions of the surface of said double metal layer above said electrode pads;

F. forming metal bumps on each of said exposed portions of said double metal layer using said photoresist film of step E as a plating mask;

G. removing said first photoresist film;

H. applying a second photoresist film of the negative type over the entire surface of said principal surface;

I. exposing predetermined portions of said second photoresist film using a photomask, said photomask having a light-passing pattern that encircles and is larger than the projection pattern of said metal bumps on said surface;

J. developing said second photoresist film to remove the unexposed portion thereof while retaining the exposed photoresist film pattern surrounding said metal bumps;

K. selectively etching away said double metal layer remaining exposed between adjacent metal bumps while concurrently retaining predetermined portions of said double metal layer in contact with and adjacent said bumps.

* * * * *